United States Patent
Zhang et al.

(10) Patent No.: US 6,189,546 B1
(45) Date of Patent: Feb. 20, 2001

(54) POLISHING PROCESS FOR MANUFACTURING DOPANT-STRIATION-FREE POLISHED SILICON WAFERS

(75) Inventors: David Zhang, Ballwin; Sharon Brumer, St. Charles; Henry F. Erk, St. Louis, all of MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/473,669

(22) Filed: Dec. 29, 1999

(51) Int. Cl.$^7$ ................................................. H01L 21/302
(52) U.S. Cl. ................. 134/1.3; 216/87; 216/89; 438/693; 438/705; 438/753
(58) Field of Search ..................... 438/692, 693, 438/705, 753; 216/87, 88, 89, 99; 134/1.3

(56) References Cited

U.S. PATENT DOCUMENTS

| | | | |
|---|---|---|---|
| 3,170,273 | 2/1965 | Walsh et al. | 51/281 |
| 5,277,769 | * 1/1994 | Medernach | 204/129.3 |
| 5,376,222 | 12/1994 | Miyajima et al. | 156/636 |
| 5,571,373 | 11/1996 | Krishna et al. | 156/636.1 |
| 5,860,848 | 1/1999 | Loncki et al. | 451/36 |
| 5,885,334 | 3/1999 | Suzuki et al. | 106/3 |

FOREIGN PATENT DOCUMENTS

| | | |
|---|---|---|
| 50-153869 | * 12/1975 | (JP). |
| 5-011225 | * 1/1993 | (JP). |
| 10-060429 | * 3/1998 | (JP). |

OTHER PUBLICATIONS

"Silicon Wafer Polishing"; Liu et al.; Proc.Elect. Soc.; 86–4 (Semicond. Silicon 1986').*

* cited by examiner

Primary Examiner—Gregory Mills
Assistant Examiner—George Goudreau
(74) Attorney, Agent, or Firm—Senniger, Powers, Leavitt & Roedel

(57) ABSTRACT

A multi-step polishing process for producing dopant-striation-free semiconductor wafers. The process includes polishing a surface of the wafer using a sodium stabilized colloidal silica slurry, an amine accelerant, and an alkaline etchant, polishing the surface of the wafer using a sodium stabilized colloidal silica slurry and an alkaline etchant which is substantially free of amine accelerants, and polishing the surface of the wafer using an ammonia stabilized colloidal silica slurry and an alkaline etchant which is substantially free of amine accelerants.

26 Claims, 3 Drawing Sheets

US 6,189,546 B1

POLISHING PROCESS FOR MANUFACTURING DOPANT-STRIATION-FREE POLISHED SILICON WAFERS

BACKGROUND OF THE INVENTION

The present invention relates generally to a process for polishing semiconductor wafers. In particular, the present invention provides a polishing process for producing dopant-striation-free polished semiconductor wafers.

Polished semiconductor wafers, such as silicon wafers, are typically obtained by slicing a single crystal ingot in a direction normal to the axis of the ingot to produce thin wafers, grinding the wafers to planarize their front and back surfaces, etching the planarized wafers to remove damage created by the slicing and grinding, and chemically/mechanically polishing at least one of the etched surfaces with a colloidal silica slurry and a chemical etchant to ensure the wafer has a highly reflective damage-free surface. Prior to polishing, the surface of the wafers typically exhibit surface roughness on the front surface and/or back surface of the wafer. In general, surface roughness appears as jagged irregularities and is characterized by a peak to peak distance of less than about 100 μm with an amplitude or vertical distance from peak to valley of about 70 nm to about 100 nm.

To reduce the surface roughness, wafers are typically polished using a three step polishing process wherein at least one surface of the wafer is subjected to an initial rough polish to remove the low frequency roughness, an intermediate polish to further reduce the low frequency component of roughness after the initial rough polish, and finally a finish polish to reduce the high frequency roughness. In conventional three step polishing processes, three separate polishing apparatus are used to perform the rough, intermediate and finish polishing steps.

The polishing method disclosed in U.S. Pat. No. 5,571,373 improves upon conventional three-step methods discussed above, by providing a polishing method, wherein a multi-step rough polishing process is used to perform both the rough and intermediate polishing steps on one apparatus. The method disclosed in U.S. Pat. No. 5,571,373 reduces both the cost and complexity of the overall polishing process over the conventional three step polishing method.

In U.S. Pat. No. 5,571,373, the rough and intermediate polish are performed on one apparatus by mounting the wafer in a first polishing apparatus, applying a sodium stabilized colloidal silica slurry and an amine reinforce alkaline etchant, such as a solution of potassium hydroxide and ethylene diamine, to a polishing material, contacting the polishing material, sodium stabilized colloidal silica slurry and amine reinforced alkaline etchant with the surface of the wafer, discontinuing the sodium stabilized colloidal silica slurry and applying an ammonia stabilized colloidal silica slurry. The wafer is quenched with an acidic solution, water rinsed, removed from the first polishing apparatus and transferred to a second polishing apparatus for finish polishing. The wafer is then finish polished on the second polishing apparatus using an ammonia stabilized colloidal silica slurry and an amine reinforced alkaline etchant on a high nap polishing material, to produce a haze free wafer having a surface roughness characterized by a peak to peak distance of less than about 100 μm and an amplitude or vertical distance from peak to valley of less than about 1 nm as measured on a 1 mm×1 mm scan with an optical interferometer.

Several wafers polished by the method disclosed in U.S. Pat. No. 5,571,373, while exhibiting superior surface roughness, may nevertheless exhibit dopant striations.

As schematically illustrated in FIGS. 1(a)–1(c), dopant striations differ from surface roughness in that dopant striations appear as annular surface irregularities concentrically positioned around the axis of the wafer, while surface roughness appears as jagged surface irregularities randomly distributed across the surface of the wafer.

FIG. 1(a) schematically illustrates a perfectly flat wafer in cross section wherein the front surface 1 and the back surface 2 are ideal planer surfaces, perpendicular to the axis 3 of the wafer. FIG. 1(b) schematically illustrates a wafer exhibiting roughness in cross section. Finally, FIG. 1(c) schematically illustrates a wafer exhibiting dopant striations in cross section, wherein an ideal planer surface 4 is normal to the axis 3 of the wafer, and tangential to a valley 5 of the striations. The amplitude of the dopant striations is equal to the distance from peak 6 adjacent to valley 5 to the ideal planer surface 4 (ie. the vertical distance from peak to valley). The wavelength is equal to the distance from peak 6 of one dopant striation, to peak 7 of the immediately adjacent dopant striation. The amplitude of the dopant striations typically ranges from at least about 10 nm to at least about 100 nm from peak to valley and the wave length, or distance from the peak of one striation to the peak of the immediately adjacent striation generally ranges from about 0.5 to about 10 mm. The amplitude and the wave length may vary across the surface of the wafer.

Dopant striations can be revealed using a "Magic Mirror" inspection tool, wherein light is reflected off of the wafer surface onto an imaging device. The imaging device produces a black and white image of the reflected light with dopant striations appearing as dark concentric rings or features in the image. In general, the Magic Mirror inspection tool is capable of detecting dopant striations having an amplitude of at least about 10 nm. For example, FIG. 2 shows an image produced by a Magic Mirror inspection tool of a P+ type silicon wafer that was polished using an ethylene diamine accelerant, wherein the wafer exhibits dopant striations (ie. dark concentric rings or features). Semiconductor wafers having dopants striations with less than about 10 nm are considered to be "dopant-striation-free" as measured by the Magic Mirror inspection tool. Alternatively, dopant striations can be measured using other surface measurement devices capable of measuring the surface topology, such as an ADE SQM model CR83 surface quality monitor which is commercially available from ADE Corporation (Charlotte, S.C.).

As device technologies continue to decrease in size down to the submicron geometry, nano-topology variations in the surface of the wafer, such as dopant striations, create problems for device manufacturers, thus device manufacturers specify featureless wafers (ie. dopant-striation-free wafers as measured by the Magic Mirror inspection tool). Therefore, semiconductor wafers exhibiting dopant striations may be rejected in the final inspection which will result in yield loss.

SUMMARY OF THE INVENTION

Among the several objects of this invention, therefore, may be noted the provision of a multi-step rough polishing process for producing semiconductor wafers with reduced surface roughness and reduced dopant striations; the provision of a polishing process for producing semiconductor wafers with reduced surface defects; the provision of a polishing process for producing semiconductor wafers with reduced bulk copper contamination; the provision of a process for improving the yield for a semiconductor production run at a relatively low cost; the provision of a process for reducing the surface roughness of a semiconductor wafer and reducing dopant striations on the surface of the wafer using a multi-step rough polishing process wherein the wafer is first polished using an amine reinforced alkaline polishing slurry, and then polished using an alkaline polishing slurry which is substantially free of amine accelerants.

It is another object of this invention to provide a simple, economical method of polishing a semiconductor wafer which does not require transfer of the wafer to another polisher prior to the intermediate polishing step and which produces semiconductor wafers with reduced dopant striations.

Briefly therefore, the process of the present invention utilizes a multi-step rough polishing process comprising applying a sodium stabilized colloidal silica slurry and a first polishing solution comprising an amine accelerant and an alkaline etchant to a polishing material, contacting the polishing material, the sodium stabilized colloidal silica slurry, and the first solution with at least one surface of the wafer as the wafer moves relative to the polishing material, discontinuing the first solution and applying a second polishing solution comprising an alkaline etchant, substantially free of amine accelerants to the polishing material while continuing to apply the sodium stabilized colloidal silica slurry, contacting the polishing material, the sodium stabilized colloidal silica slurry, and the second polishing solution with at least one surface of the wafer as the wafer moves relative to the polishing material, discontinuing the sodium stabilized colloidal silica slurry and applying an ammonia stabilized colloidal silica slurry while continuing to apply the second polishing solution to the polishing material, and contacting the polishing material and the second polishing solution with at least one surface of the wafer as the wafer moves relative to the polishing material to remove dopant striations.

In another embodiment of the present invention, the wafer is finish polished after the rough polishing process described above utilizing a finish polishing solution comprising an ammonia stabilized colloidal silica slurry, an amine accelerant, and an alkaline etchant to remove the haze from the surface of the wafer. Alternatively, the finish polishing solution used in the finish polishing step may comprise of an ammonia stabilized colloidal silica slurry, and an alkaline etchant, substantially free of amine accelerants.

The alkaline etchant may be selected from a group consisting of metal hydroxides such as potassium hydroxide, sodium hydroxide, and alkaline salts, such as, potassium carbonate, sodium carbonate and sodium chloride. The amine may be selected from a group consisting of aniline, diphenyl amine, ethyl amine, ethylene diamine, and trimethyl amine.

DETAILED DESCRIPTION OF THE PREFERRED EMBODIMENTS

In accordance with the present invention it has been discovered that a polished semiconductor wafer can be produced at reduced costs compared to conventional polishing processes by polishing the wafer using multiple polishing solutions properly sequenced to effectively perform both a rough and an intermediate polish on the same polishing apparatus before finish polishing the wafer. Surprisingly, the polishing method of the present invention additionally produces a wafer having reduced dopant striations, fewer surface defects and reduced copper contamination compared to previous polishing methods.

While not being limited to a particular theory, it is believed that the dopant concentration in the single crystal silicon ingot varies due to variations in the crystal growth process, creating annular variations in the dopant concentration concentrically positioned around the axis of the wafer. It is believed that amine accelerants, such as ethylene diamine etch anisotropically, and preferentially etch the surface of the wafer according to the concentrations of the dopant, thereby resulting in surface irregularities referred to as dopant striations.

Additionally, wafers produced by the process of the present invention, exhibit reduced metals contamination, most notably copper contamination. Copper contamination may be measured by any apparatus capable of measuring the copper contamination in a silicon wafer, such as a Model HP4500 Induced-Coupling Plasma-Mass Spectrometry apparatus which is commercially available from Hewlett Packard (Palo Alto, Calif.). Without being bound to a particular theory, it is believed that the amine accelerant, may act as a chelating agent, forming a complex with the copper which more readily diffuses in to the wafers during the polishing process. By reducing the amine accelerant present in the second polishing solution, it is believed that the formation of the copper/amine complex is minimized thus reducing the diffusion of copper into the bulk of the wafer.

Figure 1A:
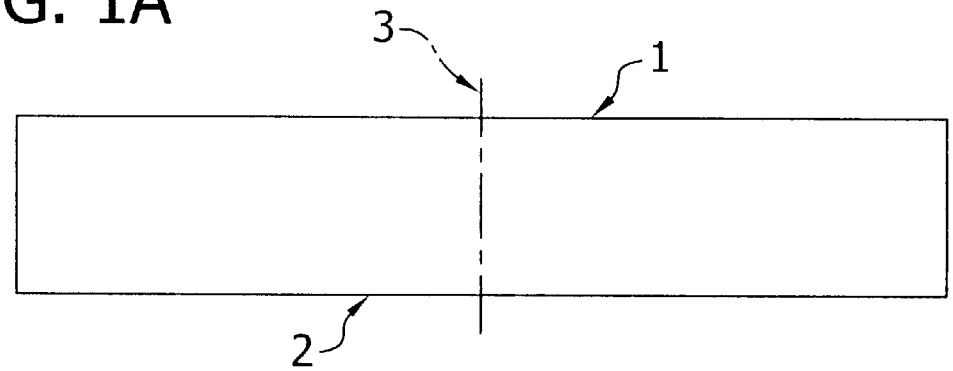
FIG. 1(a) shows a cross sectional view of a wafer wherein the front and back side surfaces are ideal planer surfaces.
Figure 1B:
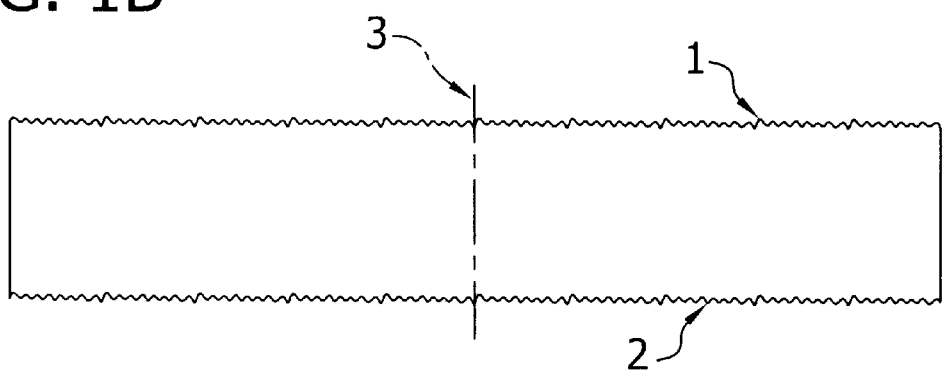
FIG. 1(b) shows a cross sectional view of a wafer exhibiting surface roughness.
Figure 1C:
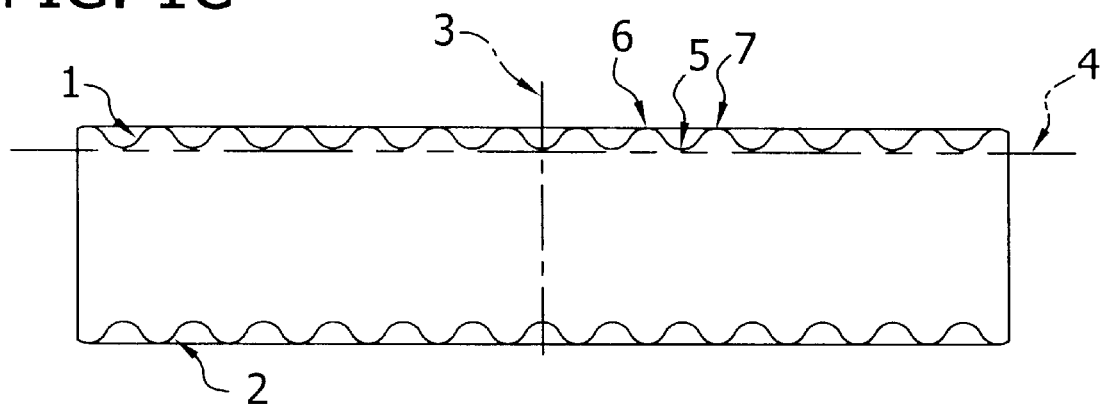
FIG. 1(c) shows a cross sectional view of a wafer exhibiting dopant striations.
Figure 2:
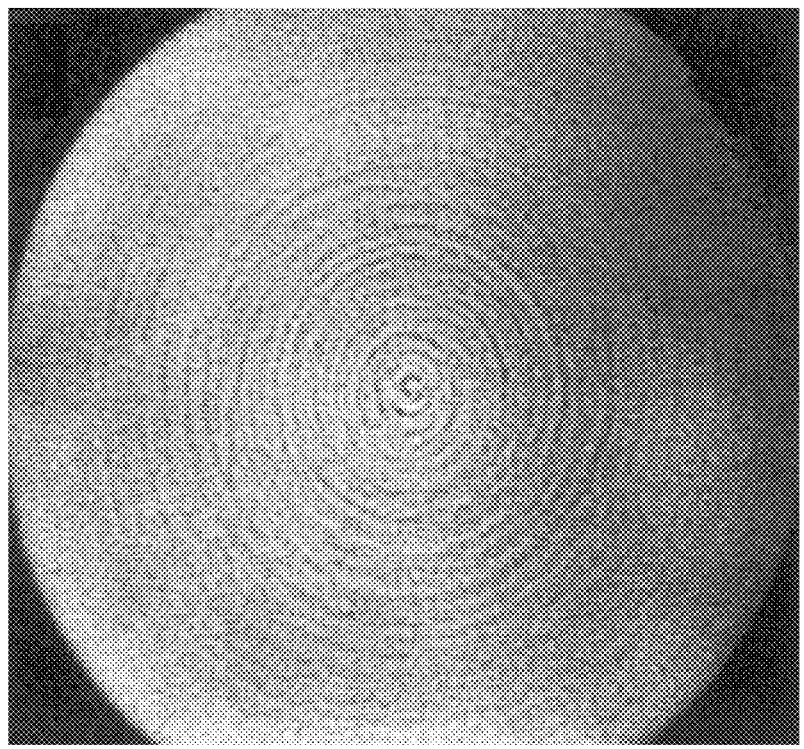
FIG. 2 shows an image produced by a Magic Mirror inspection tool of a $P^+$ type silicon wafer polished using an ethylene diamine accelerant that exhibits dopant striations.
Figure 3:
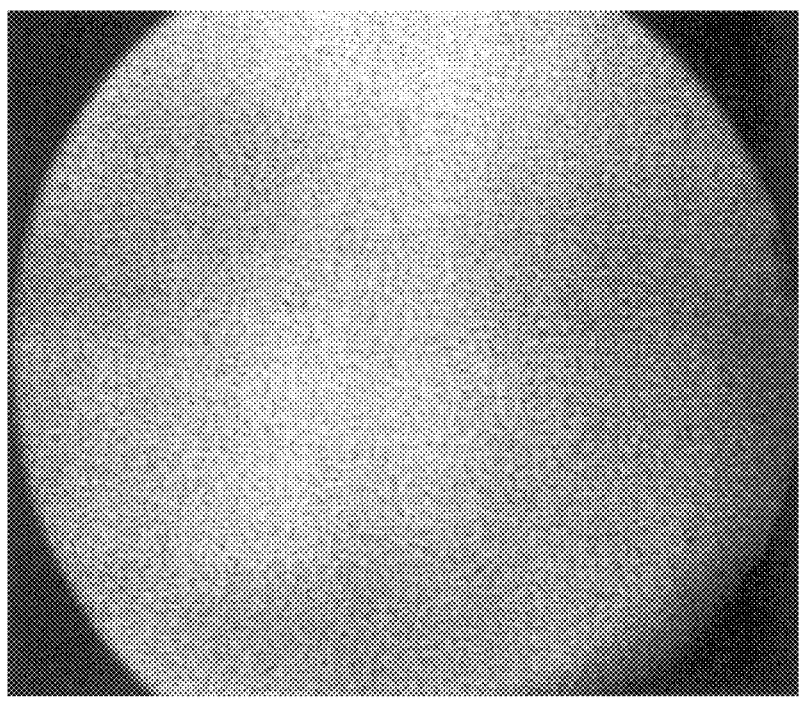
FIG. 3 shows an image produced by a Magic Mirror inspection tool of a $P^+$ type silicon wafer polished using the method of the present invention that does not exhibit dopant striations.
Figure 4:
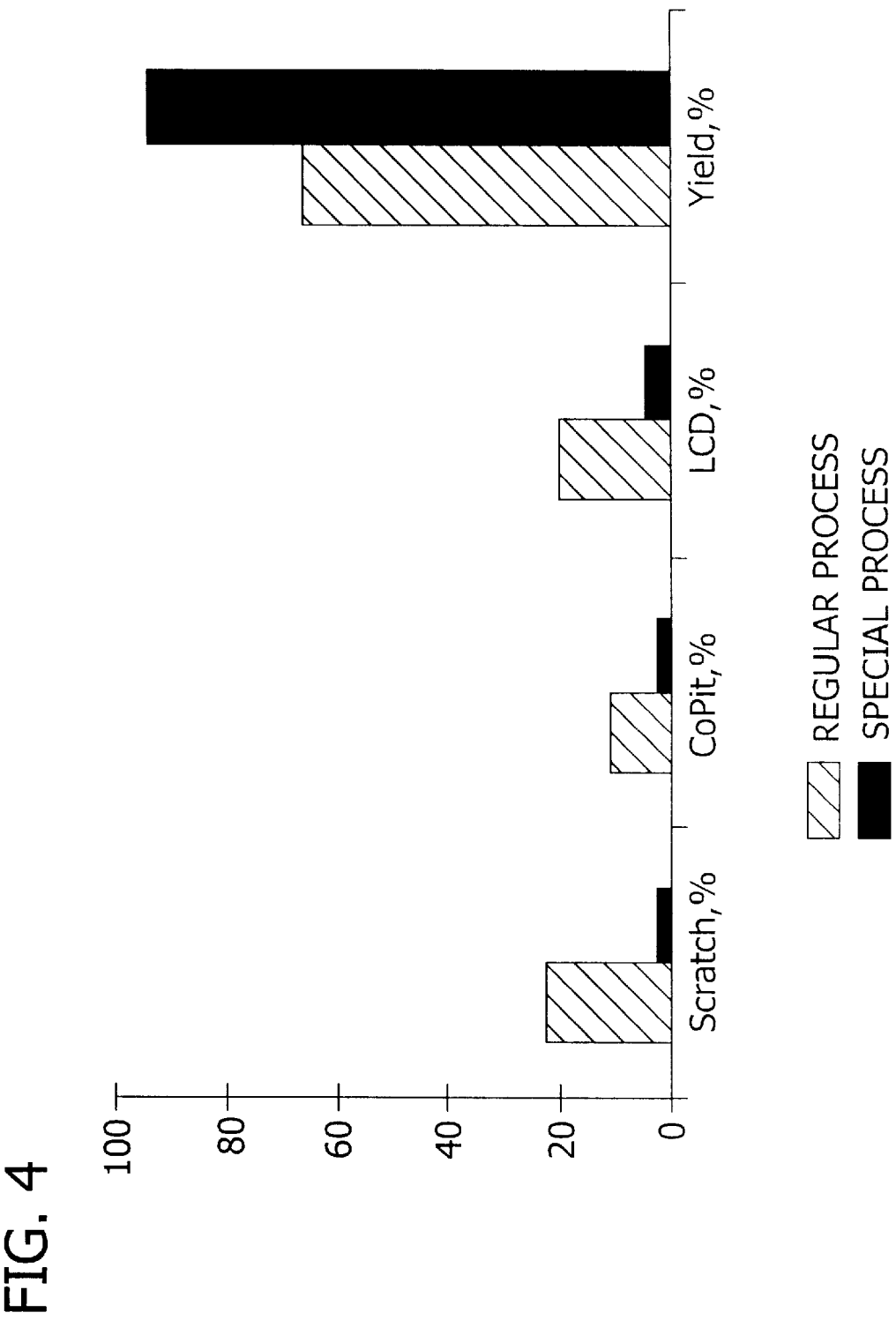
FIG. 4 shows a comparison between surface defects and yields obtained from the polishing process of the present invention to those obtained from conventional polishing.

In addition, wafers produced by the process of the present invention have a higher surface quality with less surface defects than conventional polishing processes. Without being bound to a particular theory, it is believed that amine accelerants such as ethylene diamine have a higher etch rate on silicon and/or silicon oxides compared to alkaline hydroxides. Thus, polishing solutions containing amine accelerants, while improving the polishing rate, tend to etch the oxide layers from the surface of the wafer causing it to become more susceptible to being scratched and/or damaged during polishing. Furthermore, the alkaline hydroxides have a low surface tension and can greatly reduce friction between the wafer and carriers or polishing pads thus producing less particles during the polishing process that tend to cause scratches and/or damage to the surface of the wafer. Therefore, it is believed that by appropriately sequencing at least one polishing solution containing an amine accelerant with at least one polishing solution that is substantially free of amine accelerants, the polishing process of the present invention provides the benefit of improved polishing rates without unduly damaging the surface of the wafer. As shown in FIG. 4, wafers produce by the process of the present invention have significantly fewer scratches, pits (CoPit) and light channel defects (LCD), when examined with an optical auto inspection tool, such as a CR 80 optical inspection tool which is commercially available from ADE Corporation (Charlotte, S.C.), thus resulting in a yield increase.

The starting material for the present invention is a single crystal silicon wafer which has been sliced from a single crystal ingot, mechanically shaped and chemically etched using standard grinding, lapping and/or chemical etching techniques. Such methods are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference).

The silicon semiconductor wafer may have any conductivity type and resistivity which is appropriate for a semiconductor application. Additionally, the wafer may have any diameter and target thickness which is appropriate for a semiconductor application. For example, the diameter is generally at least about 100 mm and typically is 150 mm, 200 mm, 300 mm or greater and the thickness may be from about 475 to about 900 $\mu$m or greater, with the thickness typically increasing with increasing diameter. The wafer may also have any crystal orientation. In general, however, the wafers have a <100> or <111> crystal orientation.

Having been sliced from the ingot and subjected to the mechanical and chemical shaping processes described above, the surface of the wafer generally has a surface roughness of at least about 70 nm and may be as high as 100 nm or greater. The surface roughness may be measured using any metrology device capable of measuring the surface roughness. Such devices are well known in the art. For example, the surface roughness may be measured using an MP 300 surface measurement device which is commercially available from Chapman Instruments (Rochester, N.Y.) or other metrology devices such as an AFM microscope, a Nomarski microscope at 50× magnification, a Wyko-2D microscope equipped with a 10× magnification, or an optical interferometer.

In a preferred embodiment of the invention, a wafer is placed in a carrier in a double-side polishing apparatus. While the type of double-side polishing apparatus used is not critically important to the present invention, the preferred embodiment uses a Peter Wolters AC-1400P polishing apparatus which is commercially available from Peter Wolters GmbH, (Rendsburg, Germany). As the rough polishing begins, the polishing pads are brought into contact with both surfaces of the wafer with the force of the pad against the surface being about 2 lb/in$^2$ (about 1.4 N/cm$^2$). The polishing pads and the wafer carrier are rotated while a sodium stabilized colloidal silica slurry, and a first solution comprising an amine accelerant and an alkaline etchant are dispensed onto the pad surfaces. While the rates of rotation for the carrier and/or pads are not narrowly critical, the carrier is typically rotated at a rate of about 5 RPM to about 10 RPM and the pads are rotated at a rate of about 20 RPM to about 30 RPM. The surface of the wafer is rough polished at about 40° C. for about 10 minutes to about 30 minutes. This first rough polishing removes from about 7 $\mu$m to about 30 $\mu$m of silicon from the surface of the wafer and reduces the surface roughness of the wafer to preferably no greater than 20 nm Ra over an area of about 1.6 cm$^2$, more preferably no greater than 10 nm Ra over an area of about 1.6 cm$^2$ and most preferably no greater than about 5 nm Ra over an area of about 1.6 cm$^2$ in this polishing step. The surface roughness may be measured using any metrology device capable of measuring the surface roughness. Such devices are well known in the art. For example, the surface roughness may be measured using an MP 300 surface measurement device which is commercially available from Chapman Instruments (Rochester, N.Y.) or other metrology devices such as an AFM microscope, a Nomarski microscope at 50× magnification, a Wyko-2D microscope equipped with a 10× magnification, or an optical interferometer. The amplitude of the dopant striations after the first polishing step is preferably no greater than about 40 nm, more preferably no greater than about 30 nm, and most preferably no greater than about 20 nm as measured using any surface measurement devise capable of measuring the surface topology such as an ADE SQM model CR83 surface quality monitor.

The polishing times indicated for the present invention are generally appropriate for p$^+$-type semiconductor wafers composed of silicon having a <100> crystal orientation. If silicon having a <111> orientation is used, the silicon will be more difficult to polish and will require longer polishing times. Silicon having a <110> orientation is more readily polished than silicon <100> and will require shorter polishing times. An n$^-$-type wafer will also require shorter polishing times because it etches faster than p$^+$-type wafers. However, the polishing time will be longer for an n$^+$-type wafer because it etches more slowly.

Sodium stabilized colloidal silica slurries are well known in the art, and have been described in U.S. Pat. No. 3,170,273. Syton HT-50, a preferred sodium stabilized slurry commercially available from E.I. du Pont de Nemours & Company, has a silica content of 49.2–50.5% and a particle size of 35–50 $\mu$m. The sodium stabilized colloidal silica slurry is dispensed at a flow rate of from about 50 ml/min to about 150 ml/min.

The alkaline etchant may be selected from a group consisting of metal hydroxides such as potassium hydroxide, sodium hydroxide, and alkaline salts, such as, potassium carbonate, sodium carbonate and sodium chloride. The amine may be selected from a group consisting of aniline, diphenyl amine, ethyl amine, ethylene diamine, and trimethyl amine. Preferably, the amine accelerant is ethylene diamine and the alkaline etchant is potassium hydroxide wherein the solution comprising ethylene diamine and potassium hydroxide has a pH ranging from about 11 to about 14. For example, a suitable solution can include from about 1 percent by weight to about 3 percent by weight potassium hydroxide, from about 0.9 percent by weight to about 2 percent by weight ethylene diamine and a remainder of distilled water. The solution comprising the amine accelerant and alkaline etchant is dispensed at a flow rate of from about 200 ml/min to about 300 ml/min.

The sodium stabilized colloidal silica slurry and the first polishing solution are preferably dispensed onto hard polyurethane impregnated felt pads, such as a Suba H2 pad which is commercially available from Rodel of Scottsdale, Ariz. In the preferred embodiment, Rodel Suba H2 regular pads are used on the bottom platen of the double-side polisher while Rodel Suba H2 embossed pads are used on the top platen. Alternatively, other polishing pads, such as Rodel Suba 600, 800, and 543 may be used. Appropriate polishing pads for use in rough polishing or finish polishing are well known in the art.

The first solution comprising the amine accelerant and the alkaline etchant is then discontinued and a second solution which is comprised of an alkaline etchant and is substantially free of amine accelerant is then dispensed along with the sodium stabilized colloidal silica slurry on the pad and the polishing continues for an additional time period of about 20 min to about 30 min wherein the force of the pad against the surface is about 2 lb/in$^2$ (about 1.4 N/cm$^2$) and the temperature is about 40° C.

The second solution is comprised of an alkaline etchant which may be selected from a group consisting of metal hydroxides such as potassium hydroxide, sodium hydroxide, and alkaline salts, such as, potassium carbonate, sodium carbonate and sodium chloride. Furthermore, the second solution is substantially free of amine accelerants, such as for example, aniline, diphenyl amine, ethyl amine, ethylene diamine, and trimethyl amine. That is, the polishing solution contains insufficient amine accelerant to produce dopant striations on the surface of the wafer during polishing and, more preferably, is completely free of amine accelerants. Experimental evidence suggests that polishing a wafer surface with a polishing solution having an amine accelerant concentrations of as little as about 0.12 percent by weight may result in dopant striations that are detectable by the Magic Mirror test, ie. have an amplitude of at least about 10 nm or greater. Thus, in the preferred embodiment, the second solution contains less than about 0.1 percent by weight, more preferably less than about 0.05 percent by weight, more preferably less than about 0.01 percent by weight amine accelerants and most preferably contains no amine accelerant.

This second rough polishing removes from about 7 µm to about 15 µm of silicon from the surface of the wafer and reduces the surface roughness of the wafer to preferably no greater than 10 nm Ra over an area of about 1.6 cm$^2$, more preferably no greater than 5 nm Ra over an area of about 1.6 cm$^2$, and most preferably no greater than about 1 nm Ra over an area of about 1.6 cm$^2$, and the amplitude of the dopant striations is reduced to preferably no greater than about 10 nm, more preferably no greater than about 7 nm and most preferably no greater than about 5 nm.

The sodium stabilized colloidal silica slurry is then discontinued, and an ammonia stabilized colloidal silica slurry is immediately introduced along with the second solution onto the polishing pads and the polishing continues for an additional time period of about 2 minutes to about 6 minutes wherein the force of the pad against the surface is about 2 lb/in$^2$ (about 1.4 N/cm$^2$) and the temperature is about 40° C. This third rough polishing step removes from about 0.5 µm to about 1.5 µm of silicon from the surface of the wafer and reduces the surface roughness of the wafer to preferably no greater than 1 nm Ra over an area of about 1.6 cm$^2$, more preferably no greater than about 0.5 nm Ra over an area of about 1.6 cm$^2$ and most preferably no greater than about 0.1 nm Ra over an area of about 1.6 cm$^2$, while maintaining dopant striations at preferably no greater than about 10 nm, more preferably no greater than about 7 nm and most preferably no greater than about 5 nm.

A preferred ammonia stabilized colloidal silica slurry is Glanzox 3900, which is commercially available from Fujimi Incorporated of Aichi Pref. 452, Japan. Glanzox 3900 has a silica content of about 8% to about 10% and a particle size of from about 0.025 to about 0.035 µm. If the ammonia stabilized silica slurry is not diluted prior to use, the polished wafer will not be as smooth as a wafer treated with a diluted slurry. However, the wafer will be smoother than a wafer that was rough polished using a conventional two step method. If the slurry is too dilute, it will fail to mechanically abrade the wafer surface. Generally, a dilution ranging from about 1 part silica slurry to about 10 parts distilled water to 1 part silica slurry to about 5 parts distilled water is desired. Preferably, a dilution of about 1 part silica slurry to about 8 parts distilled water is used wherein the diluted slurry is preferably dispensed at a rate of about 50 ml/min to about 150 ml/min as a solution. The precise ammonia stabilized colloidal silica slurry is not narrowly critical, and other ammonia stabilized colloidal silica slurries known in the art may be used, such as for example Glanzox 3950 which is also commercially available from Fujimi Incorporated.

When the ammonia stabilized slurry and alkaline etchant application has been completed, the rough polishing phase is complete. The wafer may then be treated with an acidic quench solution applied to the pad for an additional time period of about 2 minutes to about 6 minutes to neutralize the alkaline etchant and slurry that was applied to the wafer. The wafer is also rinsed with water for about 2 minutes to about 6 minutes at a flow rate of from about 3,000 ml/min to about 4,000 ml/min. The acidic quench solution and the water rinse can be applied simultaneously or sequentially. The upper platen is then raised and moved to the side, and the wafer is removed manually from the carrier and transferred to a finish polisher.

The acidic quench solution is generally comprised of a polyether polyol having an average molecular weight of from about 100,000 to about 1,000,000 and an organic or inorganic acid or a mixture thereof. A representative quench solution is composed of from about 0.01 to about 0.1 wt. % polyether polyol, from about 0.2 wt. % to about 0.5 wt. % isopropanol, from about 0.5 wt. % to about 5.0 wt. % hydrogen peroxide in distilled water, adjusted to a pH of from about 3.4 to about 3.6 with acetic acid or sulfuric acid. A suitable polyether polyol is Polyox WSR N-3000, a water soluble resin commercially available from Union Carbide and having a molecular weight of about 400,000. The acidic quench solution is dispensed at a flow rate of from about 700 ml/min to about 1,500 ml/min.

The continued use of the same polishing pads during the second and third steps of the rough polishing phase does not accelerate degradation of the pad or reduce the quality of the polished wafer. However, the second and third rough polishing steps do cause further reductions in the low frequency component of surface roughness and in addition, reduce the dopant striations to provide a smoother wafer as compared to a wafer subjected to conventional rough polishing processes.

Alternatively, the above described polishing method and solutions may be applied to the front and/or back surface of the wafer separately using a single sided polishing apparatus wherein the wafer is first wax bonded to a ceramic polishing block which is then mounted on the arm of the rough polisher. As the rough polishing begins, the polisher arm is lowered until it comes into contact with a hard pad on the ceramic turntable of the polisher. The turntable is then rotated while the polishing solutions described above are sequentially dispensed onto the pad surface.

The rough polished wafers can then be finish polished using conventional finish polishing methods. However, it is preferable to shorten the finish polishing time to compensate for the additional polishing time required for the second step of the rough polishing phase. A p$^+$-type wafer is typically finish polished for about 300 seconds, followed by a quench phase. A finish polishing time of about 240 seconds is conventional for a p$^-$-type wafer.

A silicon wafer may be finish polished by first mounting the ceramic block onto the finish polisher arm, lowering the arm onto a soft pad on a ceramic turntable, and rotating the turntable while an ammonia stabilized colloidal silica slurry and alkaline etchant are dispensed under relatively low temperature and pressure. The surface of the wafer is typically finish polished, wherein the force of the pad against the surface is about 5 lb/in$^2$ (about 3.5 N/cm$^2$) and the temperature is about 30° C. to about 40° C., to remove from about 0.2 µm to about 0.5 µm of silicon from the surface of the wafer, reducing the surface roughness to no greater than about 0.1 nm Ra over an area of about 1.6 cm$^2$ and, more preferably, no greater than about 0.05 nm Ra over an area of about 1.6 cm$^2$. Alternatively, an amine accelerant selected from a group consisting of aniline, diphenyl amine, ethyl amine, ethylene diamine, and trimethyl amine, may be added to the finish polishing solution to reduce the finish polishing time, however this may result in a slight increase in the dopant striations due to the presence of the amine accelerant as described earlier. The finish polishing phase can be completed by applying the acidic quench solution and water rinse solution to the wafer. The polisher arm is raised and the ceramic block is demounted. The wafer is water rinsed and demounted from the block before it is stored and transported for cleaning.

Any single or double side polisher typically used in the semiconductor industry can be used in practicing the method of the present invention. Suitable commercially available polishers are manufactured by Speedfam, R.H. Strausburgh, Westech Systems, and Lem Research Inc. The operating conditions, such as the polishing time, pressure and temperature may vary depending upon the polisher that is used.

In view of the above, it will be seen that the several objects of the invention are achieved. As various changes could be made in the above-described process without departing from the scope of the invention, it is intended that all matters contained in the above description be interpreted as illustrative and not in a limiting sense. In addition, when introducing elements of the present invention or the preferred embodiment(s) thereof, the articles "a," "an," "the" and "said" are intended to mean that there are one or more of the elements. The terms "comprising," "including" and "having" are intended to be inclusive and mean that there may be additional elements other than the listed elements.

What is claimed is:

1. A method of rough polishing a semiconductor wafer to reduce roughness and eliminate dopant striations on a surface of the wafer, the method comprising:

(a) in a first polishing step, polishing a surface of the semiconductor wafer using a sodium stabilized colloidal silica slurry and a first polishing solution comprising an amine accelerant and an alkaline etchant;

(b) after step (a), polishing the surface of the semiconductor wafer using a sodium stabilized colloidal silica slurry and a second polishing solution comprising an alkaline etchant, wherein the second polishing solution is substantially free of amine accelerants; and, (c) after step (b), polishing the surface of the semiconductor wafer using an ammonia stabilized colloidal silica slurry and the second polishing solution.

2. The method of claim 1 wherein polishing steps (a), (b) and (c) are performed on one polishing apparatus using one polishing pad.

3. The method of claim 1 further including the step of applying an acidic solution to the wafer after rinsing the wafer with deionized water to quench the second polishing solution.

4. The method of claim 3 wherein the acidic solution contains an organic or inorganic acid and a polyether polyol.

5. The method of claim 1 wherein the amine accelerant is selected from the group consisting of aniline, diphenyl amine, ethyl amine, ethylene diamine, and trimethyl amine.

6. The method of claim 1 wherein the first polishing solution comprises about 0.9% to about 2.0% amine accelerant.

7. The method of claim 1 wherein the alkaline etchant is selected from the group consisting of an alkaline hydroxide and an alkaline salt.

8. The method of claim 7 wherein the alkaline hydroxide is selected from the group consisting of potassium hydroxide and sodium hydroxide.

9. The method of claim 7 wherein the alkaline salt is selected from the group consisting of potassium carbonate, sodium carbonate, and sodium chloride.

10. The method of claim 1 wherein the first polishing solution comprises about 1% to about 3% alkaline etchant.

11. The method of claim 1 wherein the second polishing solution contains less than about 0.1 percent by weight of amine accelerant.

12. The method of claim 1 wherein the second polishing solution contains less than about 0.05 percent by weight of amine accelerant.

13. The method of claim 1 wherein the second polishing solution contains less than about 0.01 percent by weight of amine accelerant.

14. The method of claim 1 wherein the second polishing solution does not contain amine accelerant.

15. The method of claim 1 wherein the second polishing solution comprises about 1% to about 3% alkaline etchant.

16. The method of claim 1 wherein the semiconductor wafer is a single crystal silicon wafer.

17. The method of claim 1 wherein the surface roughness is reduced to no greater than 1 nm Ra over an area of about 1.6 cm$^2$.

18. The method of claim 1 wherein the surface roughness is reduced to no greater than about 0.5 nm Ra over an area of about 1.6 cm$^2$.

19. The method of claim 1 wherein the surface roughness is reduced to no greater than about 0.1 nm Ra over an area of about 1.6 cm$^2$.

20. The method of claim 1 wherein the amplitude of the dopant striations is reduced to no greater than about 10 nm.

21. The method of claim 1 wherein the amplitude of the dopant striations is reduced to no greater than about 7 nm.

22. The method of claim 1 wherein the amplitude of the dopant striations is reduced to no greater than about 5 nm.

23. The method of claim 1 further comprising the step of finish polishing the wafer.

24. The method of claim 23 wherein the wafer is finish polished using a finish polishing solution comprising an ammonia stabilized colloidal silica slurry and an alkaline etchant wherein said finish polishing solution is substantially free of amine accelerant.

25. The method of claim 23 wherein the surface roughness is reduced to no greater than about 0.1 nm Ra over an area of about 1.6 cm$^2$.

26. The method of claim 23 wherein the surface roughness is reduced to no greater than about 0.05 nm Ra over an area of about 1.6 cm$^2$.

* * * * *